United States Patent
Cheng et al.

(10) Patent No.: US 8,501,615 B2
(45) Date of Patent: Aug. 6, 2013

(54) METAL BUMP FORMATION

(75) Inventors: Ming-Da Cheng, Jhubei (TW);
Chih-Wei Lin, Xinfeng Township (TW);
Hsiu-Jen Lin, Zhubei (TW);
Tzong-Hann Yang, Taipei (TW);
Wen-Hsiung Lu, Jhonghe (TW);
Zheng-Yi Lim, Hsin-Chu (TW); Yi-Wen Wu, Xizhi (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 161 days.

(21) Appl. No.: 13/161,303

(22) Filed: Jun. 15, 2011

(65) Prior Publication Data
US 2012/0322255 A1    Dec. 20, 2012

(51) Int. Cl.
*H01L 21/44* (2006.01)

(52) U.S. Cl.
USPC ............... 438/613; 438/458; 257/E21.589

(58) Field of Classification Search
USPC ............ 438/612–616, 458; 257/737, 738, 257/E21.508, E23.012, E23.069
See application file for complete search history.

(56) References Cited

U.S. PATENT DOCUMENTS

| | | | |
|---|---|---|---|
| 6,249,963 B1 * | 6/2001 | Chou et al. | 29/843 |
| 7,125,789 B2 * | 10/2006 | Tellkamp et al. | 438/614 |
| 7,473,580 B2 * | 1/2009 | Farooq et al. | 438/108 |
| 7,713,575 B2 * | 5/2010 | Gruber et al. | 427/58 |
| 7,718,523 B1 * | 5/2010 | Yoo et al. | 438/613 |
| 2003/0193094 A1 * | 10/2003 | Takahashi et al. | 257/780 |
| 2011/0254146 A1 * | 10/2011 | Cho et al. | 257/692 |

\* cited by examiner

*Primary Examiner* — Leonard Chang
(74) *Attorney, Agent, or Firm* — Slater & Matsil, L.L.P.

(57) ABSTRACT

A system and method for forming metal bumps is provided. An embodiment comprises attaching conductive material to a carrier medium and then contacting the conductive material to conductive regions of a substrate. Portions of the conductive material are then bonded to the conductive regions using a bonding process to form conductive caps on the conductive regions, and residual conductive material and the carrier medium are removed. A reflow process is used to reflow the conductive caps into conductive bumps.

19 Claims, 10 Drawing Sheets

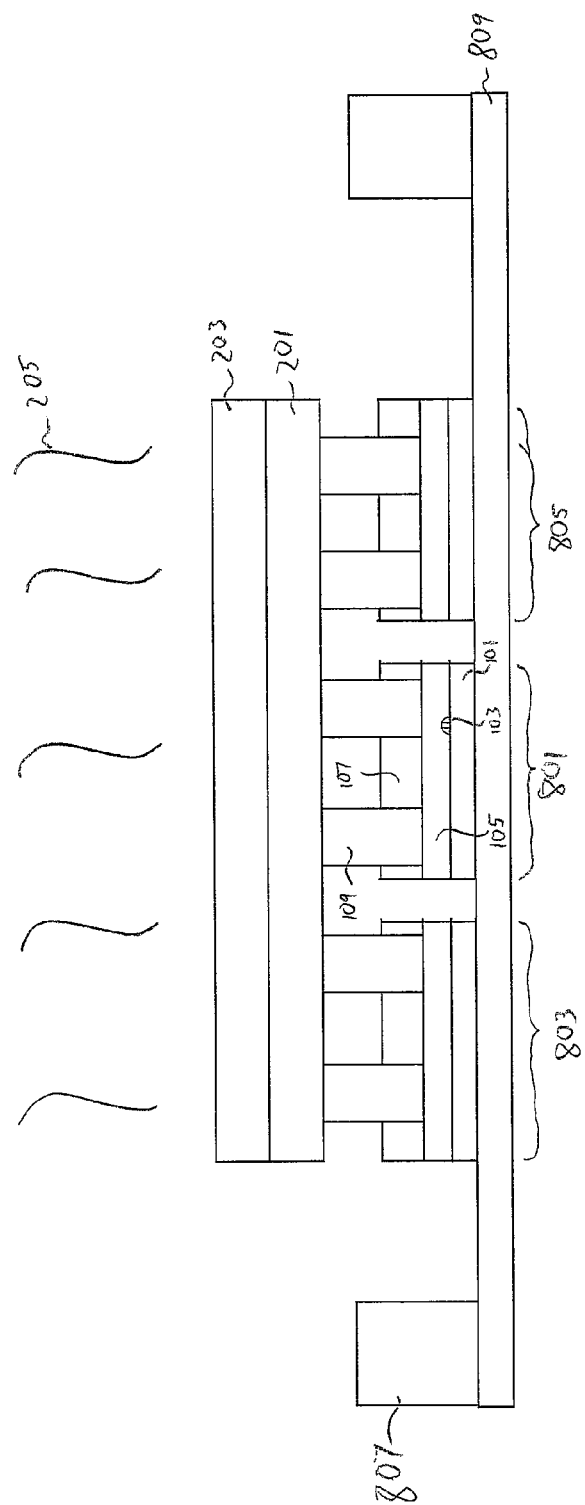
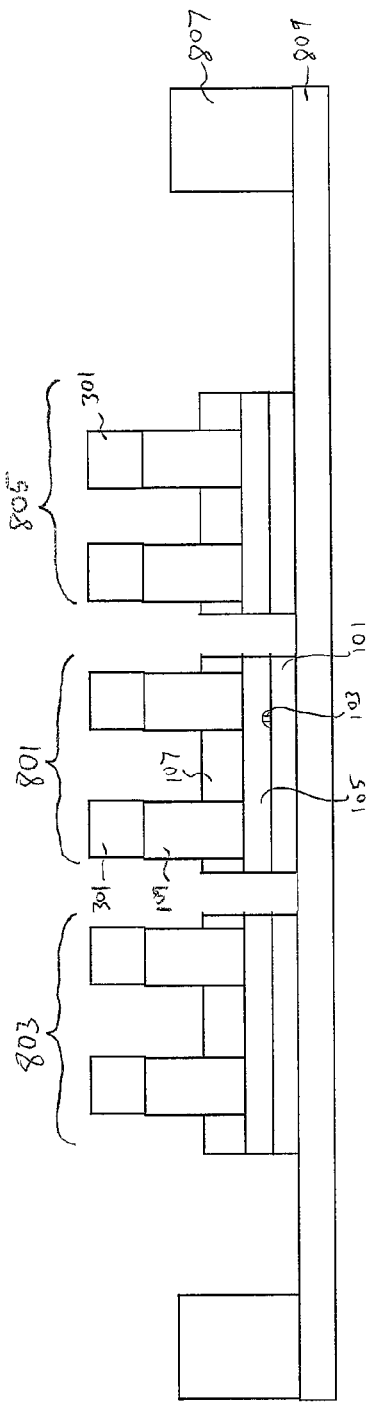
Figure 8B
Figure 8C

METAL BUMP FORMATION

BACKGROUND

Generally, semiconductor dies may be connected to other devices, such as printed circuit boards or even other semiconductor dies (e.g., in a flip chip configuration) using metallic bumps connected to conductive pads located on the semiconductor dies. These conductive pads can provide electrical input/output connections to active devices (e.g., transistor, capacitors, inductors, etc.) located on the semiconductor dies or even provide access to other dies through, e.g., through silicon vias (TSVs) that extend through the semiconductor die.

The metallic bumps may be, for example, solder bumps. These solder bumps may be capped onto the conductive pads through a process such as electroplating, in which the conductive pads are immersed in a precursor bath while an electrical current is applied to the conductive pads. The electrical current allows the solder bump to plate just the conductive pads without plating other non-conductive regions of the semiconductor die. Once the solder has been plated onto the conductive pads, the solder may then be heated until it reflows and forms into a solder ball. The solder ball may then be used to connect the semiconductor die to a printed circuit board or another semiconductor die.

However, the plating process is not an ideal method for forming these metallic bumps. In particular, the plating process is extremely complex with such process steps as immersion; application of an electrical current; monitoring and control of current, concentration of the immersion bath, and other process considerations; and the like. These process steps, in addition to being difficult to properly control and monitor, also increase the costs associated with the plating, which drives up the overall cost to manufacture the semiconductor die.

Additionally, by relying upon a plating process, the materials chosen for the metallic bump must be compatible with the plating process itself. As such, by utilizing a plating process, a manufacturer is also limiting the materials that may be used for the metallic bump. These materials may not be ideal, and may lead to a metallic bump that is less efficient than may be otherwise achievable.

BRIEF DESCRIPTION OF THE DRAWINGS

For a more complete understanding of embodiments, and the advantages thereof, reference is now made to the following descriptions taken in conjunction with the accompanying drawings, in which:

FIGS. 8A-8D illustrate an embodiment in which the conductive material is bonded during an attachment process.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that these embodiments provide many applicable inventive concepts that can be embodied in a wide variety of specific contexts. The specific embodiments discussed are merely illustrative of specific ways to make and use the embodiments, and do not limit the scope of the embodiments.

Embodiments will be described with respect to embodiments in a specific context, namely a conductive bump connector for a semiconductor die. The embodiments may also be applied, however, to other types of conductive connectors.

Figure 1:
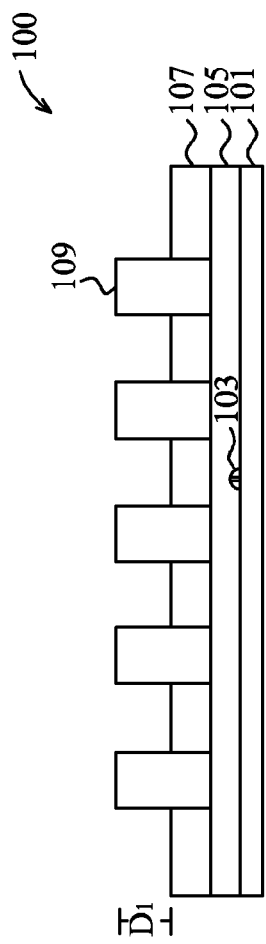
FIG. 1 illustrates a semiconductor die in accordance with an embodiment.

With reference now to FIG. 1, there is shown a semiconductor die 100 onto which conductive bumps 401 (not shown in FIG. 1 but illustrated in FIG. 4 below) are desired to be formed. The semiconductor die 100 has a substrate 101, active devices 103, metallization layers 105, a passivation layer 107 and a series of conductive pillars 109. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor die 100. The active devices 103 may be formed using any suitable methods either within or else on the surface of the substrate 101.

The metallization layers 105 are formed over the substrate 101 and the active devices 103 and are designed to connect the various active devices 103 to form functional circuitry. While illustrated in FIG. 1 as a single layer, the metallization layers 105 are formed of alternating layers of dielectric and conductive material and may be formed through any suitable process (such as deposition, damascene, dual damascene, etc.). In an embodiment there may be four layers of metallization separated from the substrate 101 by at least one interlayer dielectric layer (ILD), but the precise number of metallization layers 105 is dependent upon the design of the semiconductor die 100.

The passivation layer 107 may be formed on the metallization layers 105 over the active devices 103 in order to provide protection from physical and environmental harm that exposure may cause. The passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 107 may be formed through a process such as chemical vapor deposition (CVD), although any suitable process may be utilized, and may have a thickness between about 0.5 µm and about 5 µm, such as about 9.25 KÅ.

The conductive pillars 109 may be formed to provide conductive regions for contact between the metallization layers 105 and a first external device 501 (not shown in FIG. 1 but illustrated and discussed below with respect to FIG. 5) such as printed circuit boards or other semiconductor dies in, e.g., a flip-chip arrangement. The conductive pillars 109 may be formed by initially forming a photoresist (not shown) over the passivation layer 107 to a thickness greater than about 20 µm, or even greater than about 60 µm. The photoresist may be patterned to expose portions of the passivation layer 107 through which the conductive pillars 109 will extend. Once patterned, the photoresist may then be used as a mask to remove the desired portions of the passivation layer 107, thereby exposing those portions of the underlying metallization layers 105 to which the conductive pillars 109 will make contact.

After the passivation layer 107 has been patterned, the conductive pillars 109 may be formed within the openings of both the passivation layer 107 as well as the photoresist. The conductive pillars 109 may be formed from a conductive material such as copper, although other conductive materials such as nickel or silver, combinations of these, and the like may also be used. Additionally, the conductive pillars 109 may be formed using a process such as electroplating, by which an electric current is run through the conductive portions of the metallization layers 105 to which the conductive pillars 109 are desired to be formed, and the metallization layers 105 is immersed in a solution. The solution and the electric current deposit, e.g., copper within the openings in order to fill and/or overfill the openings of the photoresist and the passivation layer 107, thereby forming the conductive pillars 109. Excess conductive material outside of the openings may then be removed using, for example, a chemical mechanical polish (CMP).

After the conductive pillars 109 have been formed, the photoresist may be removed through a process such as ashing, whereby the temperature of the photoresist is increased until the photoresist decomposes and may be removed. After the removal of the photoresist, the conductive pillars 109 extend away from the passivation layer 107 a distance $D_1$ of between about 2 µm to about 70 µm, such as 50 µm. Optionally, a barrier layer (not shown) may be formed over the conductive pillars 109, for example, by electroless plating, wherein barrier layer may be formed of nickel, vanadium (V), chromium (Cr), and combinations thereof.

However, as one of ordinary skill in the art will recognize, the above described process to form the conductive pillars 109 is merely one such description, and is not meant to limit the embodiments to this exact process. Rather, the described process is intended to be merely illustrative, as any suitable process for forming the conductive pillars 109 may alternatively be utilized. For example, forming the passivation layer 107 to a thickness greater than its eventual thickness, forming the conductive pillars 109 into an opening of the passivation layer 107, and then removing a top portion of the passivation layer 107 such that the conductive pillars 109 extend away from the passivation layer 107 may also be utilized. All suitable processes are fully intended to be included within the scope of the present embodiments.

Figure 2:
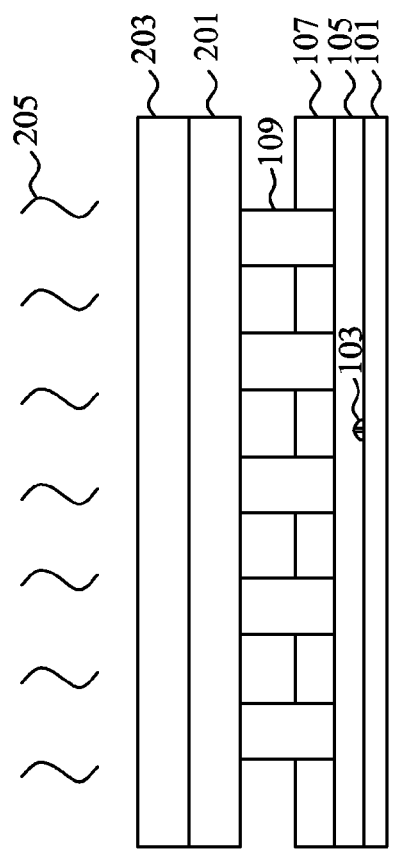
FIG. 2 illustrates the placement and bonding of a conductive material to the semiconductor die in accordance with an embodiment.

FIG. 2 illustrates the placement of conductive material 201 onto a carrier medium 203 and the contacting of the conductive material 201 to the conductive pillars 109. The carrier medium 203 may be a tape such as the commonly known blue tape, and works as a means to control the placement of the conductive material 201. As such, while the carrier medium 203 is referred to herein as a tape, the carrier medium 203 is not limited to tape, and may be any other medium, such as a carrier wafer, a carrier glass, a metal plate, or a ceramic plate, that provides for the placement of the conductive material 201 as desired.

The conductive material 201 may comprise a material such as tin, or other suitable materials, such as silver, lead-free tin, copper, tin-copper, or a tin-X-Y-Z alloy (where X or Y or Z may be silver, copper, zinc, bismuth, germanium, cerium, indium, cobalt, or other rare earth elements), combinations of these, or the like. Additionally, because the current process does not necessarily utilize electroplating, the conductive material 201 may utilize other materials that are not available if electroplating is utilized. For example, additives such as bismuth, germanium, nickel, indium, combinations of these, and the like, may also be utilized for the conductive material 201.

As an example, the conductive material 201 may comprise tin at a volume percentage of between about 0.1% and about 100%, such as about 98%. Additionally, bismuth may be added to the tin such that the bismuth has a volume percentage of between about 0.001% and about 0.1%, such as about 0.01%. By by-passing the electroplating, the range of available materials is enlarged and may include materials that are not suitable for the electroplating process.

In an embodiment in which the conductive material 201 is a combination of tin and bismuth, the conductive material 201 may be formed by initially forming a layer of tin and bismuth through such methods as stencil plating, printing, evaporation, etc., to a thickness of between about 10 µm and about 30 µm, such as about 15 µm. However, the precise method of forming the conductive material 201 onto the carrier medium 203 may be tailored to the materials to be used for the conductive material 201. For example, if no additives were desired to be added, and the conductive material 201 is suitable for electroplating, electroplating may be used to form place the conductive material 201 onto the carrier medium 203 while still avoiding electroplating onto the conductive pillars 109.

After the conductive material 201 has been placed onto the carrier medium 203, the carrier medium 203 may be utilized to place the conductive material 201 in physical contact with the conductive pillars 109. This contact provides an electrical connection between the conductive pillars 109 and the conductive material 201, which eventually will be used to provide an electrical connection to the first external device 501 (not shown in FIG. 2 but illustrated and discussed below with respect to FIG. 5) such as printed circuit boards or even other semiconductor die.

FIG. 2 additionally illustrates a heating and bonding process 205 (represented in FIG. 2 by the wavy lines) which may be used to bond or otherwise attach portions of the conductive material 201 to the conductive pillars 109 once the carrier medium 203 has been used to place the conductive material 201 in contact with the conductive pillars 109. The heating and bonding process 205 may utilize a thermal anneal with a temperature of between about 100° C. and about 400° C., such as about 240° C. along with a pressure of between about 5 kN and about 100 kN, such as about 30 kN. This temperature and pressure may be held for between about 5 seconds and about 200 seconds, such as about 35 seconds, or until those portions of the conductive material 201 that are in contact with the conductive pillars 109 are bonded to the conductive pillars 109. However, any other process that may be used to attach the conductive material 201 to the conductive pillars 109 may alternatively be used.

Figure 3:
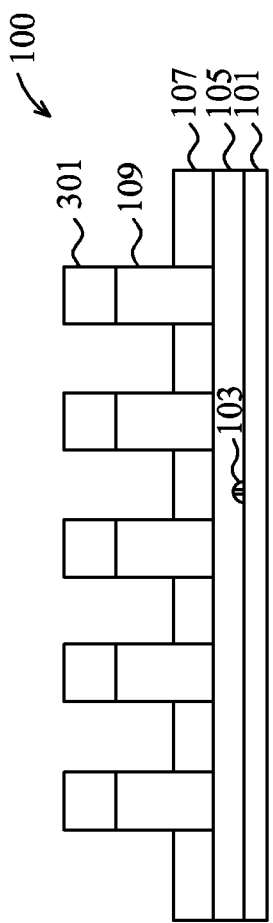
FIG. 3 illustrates the removal of portions of the conductive material to form conductive caps in accordance with an embodiment.

FIG. 3 illustrates that, after the heating and bonding process 205 has been completed, the carrier medium 203 may be removed, thereby leaving conductive caps 301 on the conductive pillars 109. The conductive caps 301 are those portions of the conductive material 201 that bonded to the conductive pillars 109 during the heating and bonding process 205 (see FIG. 2). Furthermore, while the conductive caps 301 remain on the conductive pillars 109 (as the conductive caps 301 are bonded to the conductive pillars 109), the remainder of the conductive material 201 that was not bonded to the conductive pillars 109 during the heating and bonding process 205 remains with the carrier medium 203 as it is removed, thereby removing the un-bonded conductive material 201 along with the carrier medium 203. The removed un-bonded conductive material 201 may then be recycled so that none of the material is wasted, thereby reducing the overall costs of manufacturing.

The removal of the carrier medium 203 may consist of physically separating the carrier medium 203 (along with the non-bonded conductive material 201) from the conductive pillars 109. For example, the carrier medium 203 may be pulled away from the semiconductor die 100 using a chuck or vacuum holder (not shown in FIG. 3). However, while a physical separation process has been described, the embodiments described are not intended to be limited to this physical separation process, and any other suitable process that separates the carrier medium 203 (along with the un-bonded conductive material 201) from the semiconductor die 100 may alternatively be utilized.

By utilizing the carrier medium 203 and the heating and bonding process 205, the conductive material 201 can be effectively transferred to the conductive pillars 109 to form the conductive caps 301 without electroplating. By by-passing the electroplating process, the overall process of manufacturing the semiconductor die 100 can be simplified, and the overall cost of manufacturing can be reduced. Additionally, by by-passing the electroplating process, additional materials may be utilized for the conductive material 201 that may not necessarily be used in electroplating. Both of these improvements can help make the semiconductor die 100 easier to manufacture, cheaper to manufacture, and more efficient to operate.

Figure 4:
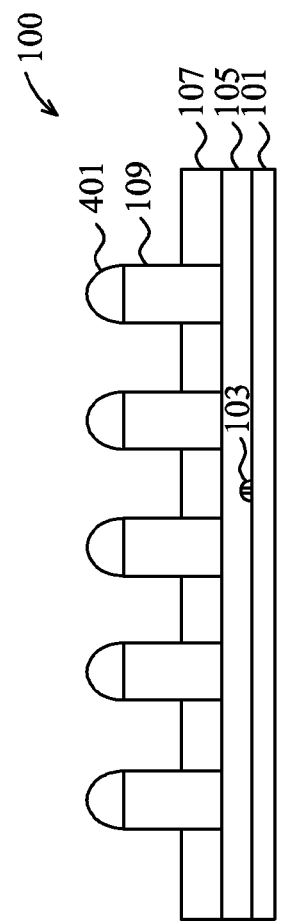
FIG. 4 illustrates a reflow process to form conductive bumps in accordance with an embodiment.

FIG. 4 illustrates that once the conductive caps 301 have been transferred and the carrier medium 203 has been removed, a reflow process may be performed to transform the conductive caps 301 into conductive bumps 401. In the reflow process the temperature of the conductive caps 301 is raised to a temperature higher than the heating and bonding process 205 (discussed above with respect to FIG. 2) between about 200° C. and about 350° C., such as about 240° C. for a time of between about 20 seconds and about 200 seconds, such as about 60 seconds, in order to liquefy the conductive caps 301. Once liquefied, the surface tension of the conductive caps 301 will pull the conductive caps 301 into a ball shape, thereby forming the conductive bumps 401.

Figure 5:
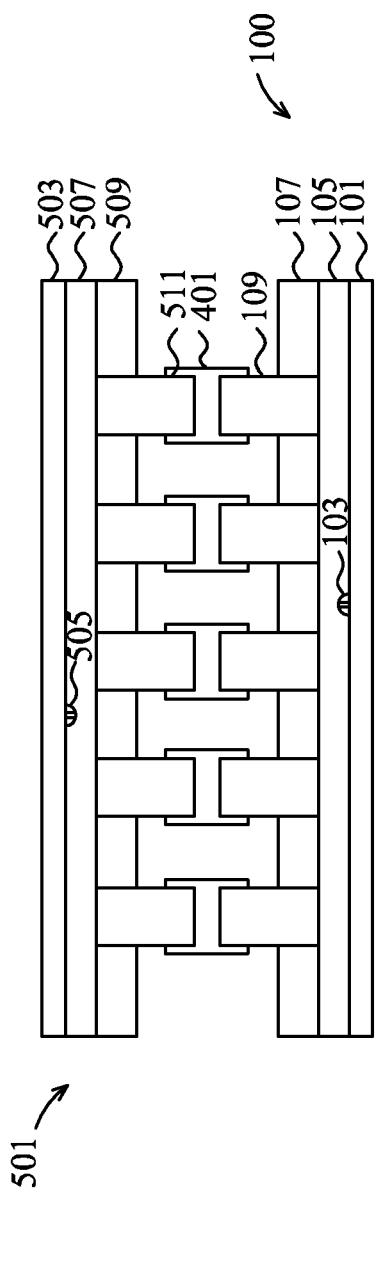
FIG. 5 illustrates the connection of the semiconductor die to another device in accordance with an embodiment.

FIG. 5 illustrates the connection of the semiconductor die 100 with the first external device 501. The first external device 501 may be, for example, a printed circuit board, a semiconductor packaging substrate, or, as illustrated in FIG. 5, another semiconductor die with a second substrate 503, second active devices 505, second metallization layers 507, a second passivation layer 509, and second conductive pillars 511. However, the first external device 501 is not meant to be limited to any of the illustrative devices listed herein, and may alternatively be any device suitable for contacting to the semiconductor die 100.

In the embodiment illustrated in FIG. 5, the first external device 501 may be connected to the semiconductor die 100 in, e.g., a flip-chip configuration. In this embodiment, the semiconductor die 100 is positioned such that the second conductive pillars 511 are in physical contact with the conductive bumps 401. Once in position, the conductive bumps 401 are heated and pressure is applied in order to liquefy the conductive bumps 401 and bond the conductive bumps 401 to the second conductive pillars 511, thereby establishing an electrical contact between the conductive pillars 109 of the semiconductor die 100 with the second conductive pillars 511 of the first external device 501 using the conductive bumps 401 as a connecting medium.

By utilizing the conductive bumps 401, a connection between the semiconductor die 100 and an external device such as the first external device 501 may be formed without requiring the use of electroplating in order to form the conductive bumps 401. By by-passing the complicated process step of electroplating, complicated process steps may be avoided and an expanded range of materials may be utilized. By removing the complications and expanding the range of materials, the overall process may be simplified and costs may be reduced, thereby allowing for a cheaper, more efficient semiconductor die to be formed.

Figure 6A:
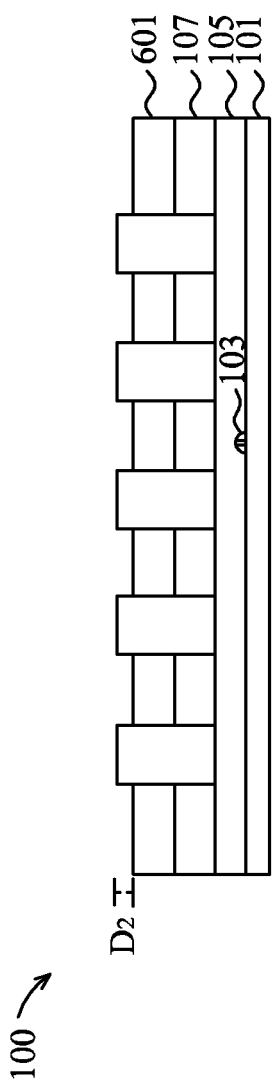
FIGS. 6A-6D illustrate a formation process utilizing a photoresist in accordance with an embodiment.

FIG. 6A illustrates another embodiment in which a photoresist 601 may be used to protect the passivation layer 107 and other underlying structures. The photoresist 601 may be a photo-reactive material any may be placed onto the semiconductor die 100 through, e.g., spin-coating. Once in position the photoresist 601 may be patterned in order to expose the conductive pillars 109 through a suitable exposure and developing process. In an embodiment the photoresist 601 may be formed such that the photoresist 601 may extend beyond the conductive pillars 109 a second distance $D_2$ of less than about 20 μm, such as about 2 μm.

Figure 6B:
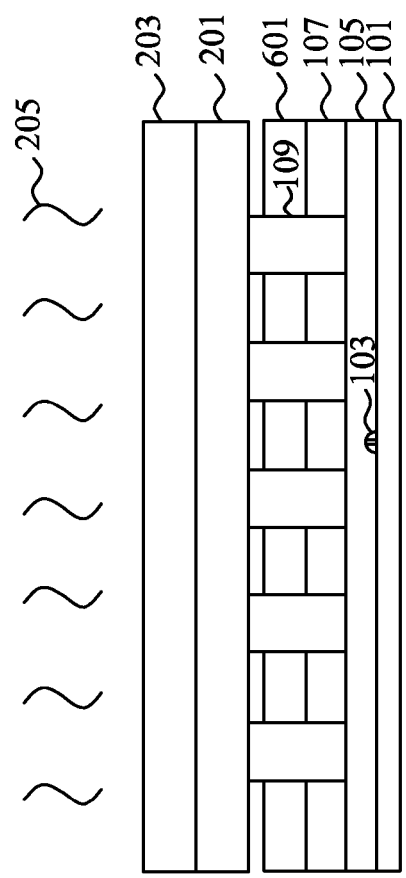

FIG. 6B illustrates that, once the photoresist 601 has been formed, the conductive material 201 on the carrier medium 203 may be placed into contact with the conductive pillars 109 and heated and bonded. However, in this embodiment the photoresist 601 remains over the passivation layer 107 in order to provide further protection. The placement of the conductive material 201 and the heating and bonding process 205 of the conductive material 201 to the conductive pillars 109 may be formed similar to the heating and bonding process 205 described above with respect to FIG. 2.

Figure 6C:
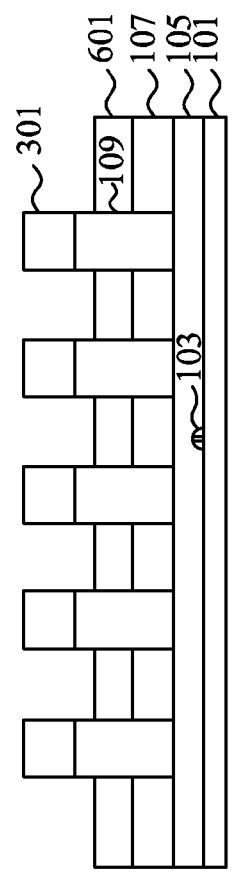

FIG. 6C illustrates that, once the heating and bonding process 205 has been performed, the carrier medium 203 may be removed along with the unreacted conductive material 201 in order to leave the conductive caps 301 on the conductive pillars 109. Similar to the conductive caps 301 described above with respect to FIG. 3, the conductive caps 301 are those portions of the conductive material 201 that bonded to the conductive pillars 109 during the heating and bonding process 205. The removal of the carrier medium 203 in this embodiment may be similar to the removal of the carrier medium 203 described above with respect to FIG. 3.

Figure 6D:
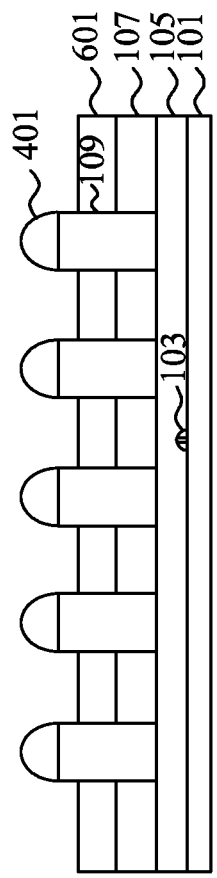

FIG. 6D illustrates that, in an embodiment, a reflow of the conductive caps 301 may be performed while the photoresist 601 remains over the passivation layer 107. The reflow of this embodiment may be similar to the reflow described above with respect to FIG. 4, such as heating the conductive caps 301 to a temperature of between about 200° C. and about 350° C. for between about 20 seconds and about 200 seconds. This reflow may cause the conductive caps 301 to partially liquefy and form a ball shape to form conductive bumps 401 while the photoresist 601 remains over the passivation layer 107 in order to provide further protection.

Once the reflow of the conductive caps 301 has formed the conductive bumps 401, the photoresist 601 may be removed from the semiconductor die 100 by a suitable process such as ashing, whereby the temperature of the photoresist is increased until the photoresist decomposes. The resulting structure would resemble the structure illustrated in FIG. 4, but would have the additional advantage of additional protection of the photoresist during the formation of the conductive bumps 401.

Figure 7A:
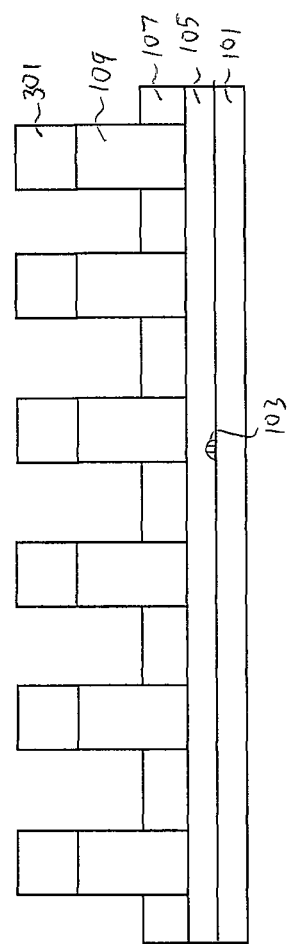
FIGS. 7A-7B illustrate another embodiment in which the photoresist is removed prior to a reflow process.

FIG. 7A illustrates yet another embodiment similar to the embodiment described above with respect to FIGS. 6A-6C. However, in the embodiment illustrated in FIG. 7A, the photoresist 601 may be removed, e.g., by ashing, subsequent to the removal of the carrier medium 203 and prior to the reflow of the conductive caps 301. In such an embodiment the semiconductor die 100 has had the additional protection of the photoresist 601 during the processing to form the conductive caps 301.

Figure 7B:
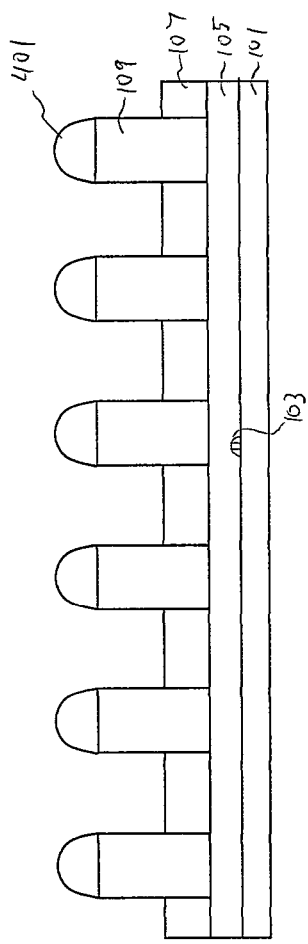

FIG. 7B illustrates the formation of the conductive bumps 401 from the conductive caps 301 (see FIG. 7A) after the photoresist 601 has been removed. Similar to the formation of the conductive bumps 401 from the conductive caps 301 described above with reference to FIGS. 1-4, the formation of the conductive bumps 401 may be performed, for example, using a reflow process. In the reflow process the temperature of the conductive caps 301 is raised to a temperature of, e.g., between about 200° C. and about 350° C., such as about 240° C. for a time of between about 20 seconds and about 200 seconds, such as about 60 seconds, in order to liquefy the conductive caps 301. Once liquefied, the surface tension of the conductive caps 301 will pull the conductive caps 301 into a ball shape, thereby forming the conductive bumps 401.

Figure 8A:
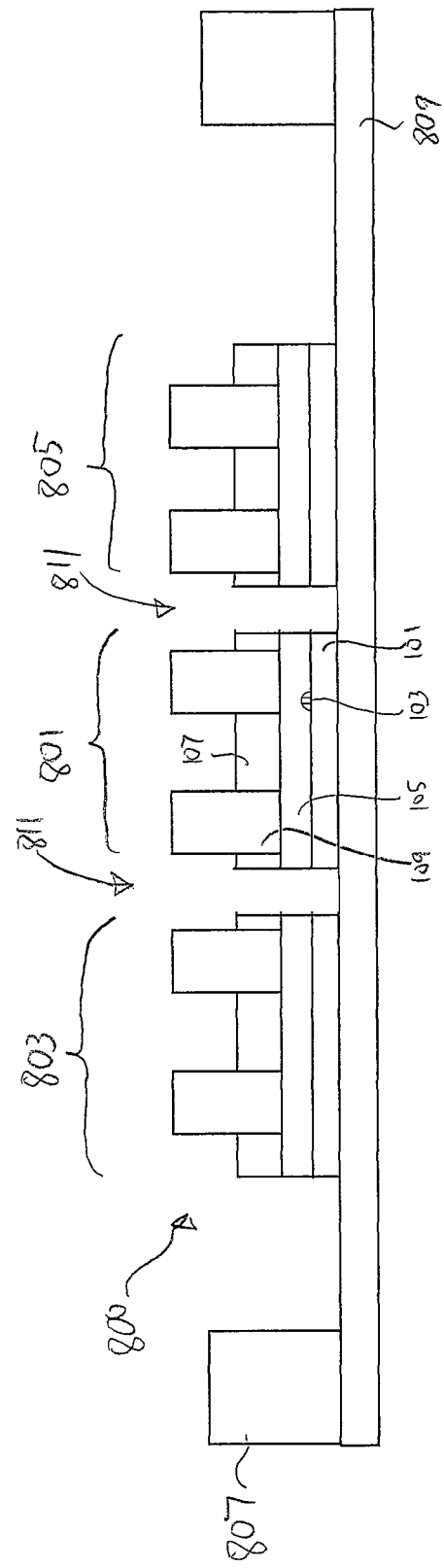

FIGS. 8A-8D illustrate yet another embodiment in which the conductive material 201 may be applied to the conductive pillars 109 during a die attachment process. FIG. 8A illustrates a wafer 800 onto which a first semiconductor die 801, a second semiconductor die 803 and a third semiconductor die 805 have been formed. Furthermore, while only three semiconductor dies are illustrated in FIG. 8A as being formed on the wafer 800, it should be understood that any suitable number of dies may alternatively be used while still remaining within the scope of the embodiment. In this embodiment, the first semiconductor die 801 may be similar to the semiconductor die 100 (e.g, with conductive pillars 109 and active devices 103), although the precise number of individual structures such as the conductive pillars 109 may vary.

FIG. 8A further illustrates that after the first semiconductor die 801, the second semiconductor die 803 and the third semiconductor die 805 have been formed on the wafer 800, the first semiconductor die 801, the second semiconductor die 803 and the third semiconductor die 805 may be singulated from the wafer 800. In an embodiment the wafer 800 may be placed into a dicing frame 807 and attached to, e.g., a dicing tape 809 in order to provide support for the first semiconductor die 801, the second semiconductor die 803 and the third semiconductor die 805 while they are being singulated from the wafer 800.

Once the wafer 800 has been attached to the dicing tape 809 (using, e.g., an adhesive located on the dicing tape 809) within the dicing frame 807, the first semiconductor die 801, the second semiconductor die 803 and the third semiconductor die 805 may be singulated by thinning the wafer 800 in between the first semiconductor die 801, the second semiconductor die 803 and the third semiconductor die 805 so as to form openings 811 that extend through the wafer 800 and separate the individual dies from each other. In an embodiment the openings 811 may be formed using a dicing saw, although any other suitable method of singulating the dies, such as etching, may alternatively be utilized.

FIG. 8B illustrates that, after the first semiconductor die 801, the second semiconductor die 803 and the third semiconductor die 805 have been singulated from the wafer 800 but still remain within the dicing frame 807 and attached to the dicing tape 809, the conductive material 201 on the carrier medium 203 may be placed in contact with the conductive pillars 109 on the first semiconductor die 801, the second semiconductor die 803 and the third semiconductor die 805. In an embodiment the conductive material 201 and the carrier medium 203 may be similar to the conductive material 201 and the carrier medium 203 discussed above with respect to FIG. 2.

FIG. 8B additionally illustrates that the heating and bonding process 205 may be used to bond the conductive material 201 to the conductive pillars 109. In an embodiment the heating and bonding process 205 in FIG. 8B may be similar to the heating and bonding process 205 discussed above with respect to FIG. 2. For example, the heating and bonding process 205 may utilize a thermal anneal with a temperature of between about 100° C. and about 400° C., such as about 240° C. along with a pressure of between about 5 kN and about 100 kN, such as about 30 kN. This temperature and pressure may be held for between about 5 seconds and about 200 seconds, such as about 35 seconds, or until those portions of the conductive material 201 that are in contact with the conductive pillars 109 are bonded to the conductive pillars 109. However, any other process that may be used to bond or otherwise attach the conductive material 201 to the conductive pillars 109 may alternatively be used.

FIG. 8C illustrates that, once the conductive material 201 has been bonded to the conductive pillars 109, the carrier medium 203 and unbonded conductive material 201 may be removed from the first semiconductor die 801, the second semiconductor die 803 and the third semiconductor die 805 in order to leave conductive caps 301 on the conductive pillars 109. The carrier medium 203 may be removed, e.g., through a physical separation process or any other suitable process, thereby also removing the unbonded conductive material 201.

Figure 8D:
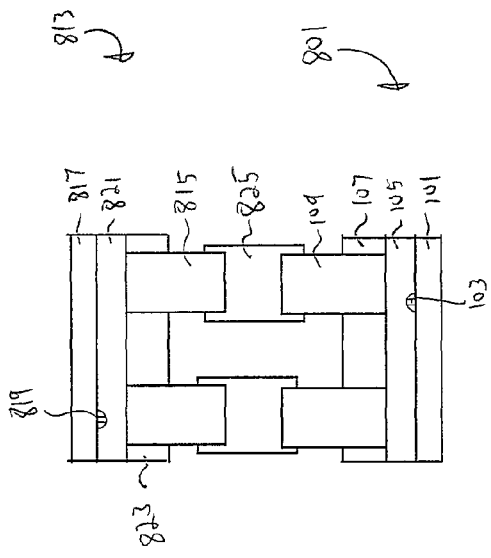

FIG. 8D illustrates that, after the conductive caps 301 have been formed while the first semiconductor die 801 is attached to the dicing tape 809, the first semiconductor die 801 may be debonded from the dicing tape 809 and the conductive caps 301 on the first semiconductor die 801 may be placed into contact with third conductive pillars 815 of a second external device 813. In an embodiment the second external device 813 may be similar to the first external device 501 discussed above with respect to FIG. 5 (with a third substrate 817, third active devices 819, third metallization layers 821, and a third passivation layer 823), and the third conductive pillars 815 may be similar to the second conductive pillars 511.

Once the conductive caps 301 have been placed into contact with the third conductive pillars 815, a reflow process may be performed to reflow the conductive caps 301 and form physical and electrical bonds 825 between the conductive pillars 109 and the third conductive pillars 815. In an embodiment the reflow process may include raising the temperature of the conductive caps 301 to a temperature of, e.g., between about 200° C. and about 350° C., such as about 240° C. for a time of between about 20 seconds and about 200 seconds, such as about 60 seconds, in order to liquefy the conductive caps 301 and form the bonds 825. In this fashion the conductive caps 301 may be utilized to bond the conductive pillars 109 with the third conductive pillars 815 without first having to form the conductive bumps 401 (discussed above with respect to FIG. 4).

Figure 9A:
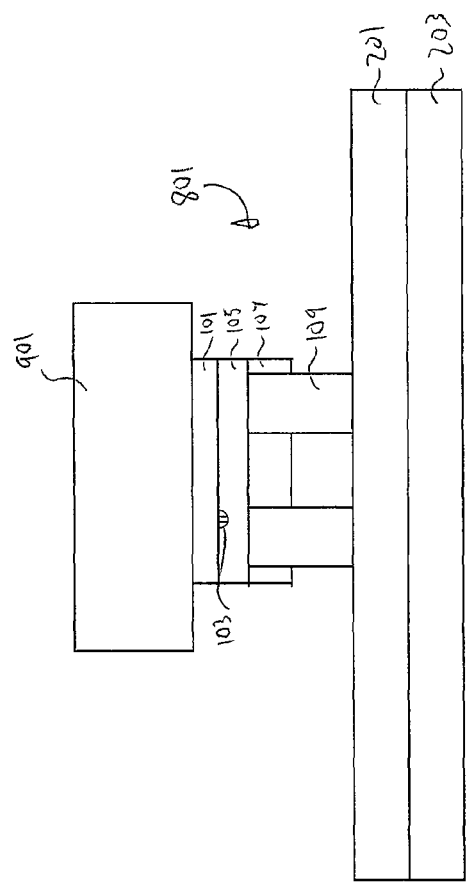
FIGS. 9A-9C illustrate an embodiment in which the conductive material is bonded after the semiconductor die has been singulated and removed from a wafer.
Figure 9B:
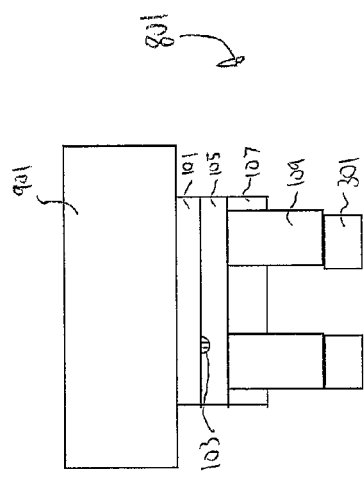
Figure 9C:
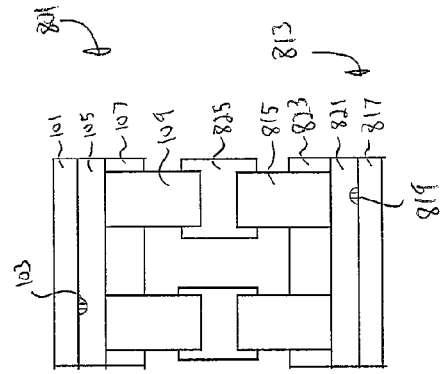

FIGS. 9A-9C illustrate yet another embodiment in which the first semiconductor die 801 may be bonded to the second external device 813. In this embodiment the first semiconductor die 801 may be singulated from the wafer 800 (not shown in FIG. 9A but illustrated in FIG. 8A) and then removed from the dicing tape 809 and the dicing frame 807 (also not shown in FIG. 9A as the first semiconductor die 801 has already been removed). In this embodiment the first semiconductor die 801 may be removed from the dicing tape 809 using, e.g., a pick and place tool 901 that can physically remove and control the placement of the first semiconductor die 801. For example, the pick and place tool 901 may use a vacuum collet or suction head in order to hold the first semiconductor die 801 to the pick and place tool 901 and may use the vacuum collet or suction head to handle and manipulate the first semiconductor die 801 in order to precisely place the first semiconductor die 801 where desired.

After being removed from the dicing tape 809 and dicing frame 807, the conductive pillars 109 of the first semiconductor die 801 and the conductive material 201 on the carrier medium 203 may be placed into contact with each other. This placement may be performed by using the pick and place tool 901 to place the conductive pillars 109 into contact with the conductive material 201, by placing the conductive material into contact with the conductive pillars 109, or some combination of placements. In this embodiment the conductive material 201 and the carrier medium 203 may be similar to the conductive material 201 and the carrier medium 203 discussed above with respect to FIG. 2.

FIG. 9A further illustrates that the heating and bonding process 205 may be used to bond the conductive material 201 to the conductive pillars 109. In an embodiment the heating and bonding process 205 in FIG. 9A may be similar to the heating and bonding process 205 discussed above with respect to FIG. 2. For example, the heating and bonding process 205 may utilize a thermal anneal with a temperature of between about 100° C. and about 400° C., such as about 240° C. along with a pressure of between about 5 kN and about 100 kN, such as about 30 kN. This temperature and pressure may be held for between about 5 seconds and about 200 seconds, such as about 35 seconds, or until those portions of the conductive material 201 that are in contact with the conductive pillars 109 are bonded to the conductive pillars 109. However, any other process that may be used to bond or otherwise attach the conductive material 201 to the conductive pillars 109 may alternatively be used.

FIG. 9B illustrates that, once the conductive material 201 has been bonded to the conductive pillars 109, the carrier medium 203 and unbonded conductive material 201 may be removed from the first semiconductor die 801 in order to leave conductive caps 301 on the conductive pillars 109 of the first semiconductor die 801. The carrier medium 203 may be removed, e.g., through a physical separation process or any other suitable process, thereby also removing the unbonded conductive material 201.

FIG. 9C illustrates that, after the conductive caps 301 have been formed, the conductive caps 301 may be placed into contact with the third conductive pillars 815 of the second external device 813. Once the conductive caps 301 have been placed into contact with the third conductive pillars 815, a reflow process may be performed to reflow the conductive caps 301 and form physical and electrical bonds 825 between the conductive pillars 109 and the third conductive pillars 815. In an embodiment the reflow process may include raising the temperature of the conductive caps 301 to a temperature of, e.g., between about 200° C. and about 350° C., such as about 240° C. for a time of between about 20 seconds and about 200 seconds, such as about 60 seconds, in order to liquefy the conductive caps 301 and form the bonds 825. In this fashion the conductive caps may be utilized to form the bonds 825 without first forming the conductive bumps 401 (discussed above with respect to FIG. 4).

In accordance with an embodiment a method for manufacturing a semiconductor device comprising providing a substrate with an exposed conductive region is provided. A layer of conductive material is contacted to the conductive region, the conductive material comprising a first region in contact with the conductive region and a second region not in contact with the conductive region. The second region is separated from the first region.

In accordance with another embodiment, a method of manufacturing a semiconductor device comprising forming a conductive pillar over a substrate is provided. A layer of conductive material attached to a carrier medium is provided, and the layer of conductive material is contacted to the conductive pillar using the carrier medium. A first portion of the layer of conductive material is bonded to the conductive pillar, and the carrier medium is removed from the first portion of the layer of conductive material.

In accordance with yet another embodiment, a method of manufacturing semiconductor devices comprising providing a conductive region over a substrate is provided. A conductive material on a carrier medium is provided, the conductive material having a first region and a second region, the first region being adjacent the second region. The first region of the conductive material is attached to the conductive region of the substrate, and the second region is separated from the first region. The first region of the conductive material is reflowed to form a conductive bump.

Although the embodiments and their advantages have been described in detail, it should be understood that various changes, substitutions and alterations can be made herein without departing from the spirit and scope of the embodiments as defined by the appended claims. For example, the precise method of formation of the conductive pillars 109 may be varied. As another example, it will be readily understood by those skilled in the art that materials and processes may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for manufacturing a semiconductor device, the method comprising:
providing a substrate with an exposed conductive region;
contacting a layer of conductive material to the conductive region, the conductive material comprising a first region in contact with the conductive region and a second region not in contact with the conductive region, wherein the layer of conductive material is a continuous blanket layer connected to a carrier medium; and separating the second region from the first region.

2. The method of claim 1, further comprising reflowing the first region to form one or more conductive bumps.

3. A method of claim 1, wherein the carrier medium is a tape.

4. The method of claim 1, wherein the conductive material comprises germanium or bismuth.

5. The method of claim 1, further comprising bonding the first region to the conductive region, wherein the bonding is performed at least in part through heating the layer of conductive material.

6. The method of claim 1, further comprising forming a photoresist over the substrate adjacent to the conductive region.

7. A method of manufacturing a semiconductor device, the method comprising:
    providing a conductive pillar over a substrate;
    providing a layer of conductive material attached to a carrier medium; contacting the layer of conductive material to the conductive pillar using the carrier medium;
    bonding a first portion of the layer of conductive material to the conductive pillar without bonding a second portion of the layer of conductive material, wherein the second portion is over the substrate but not over the conductive pillar; and
    removing the carrier medium from the first portion of the layer of conductive material.

8. The method of claim 7, further comprising reflowing the first portion of the layer of conductive material to form a conductive bump.

9. The method of claim 7, wherein the conductive material comprises bismuth or germanium.

10. The method of claim 7, further comprising forming a photoresist over the substrate and adjacent to the conductive pillar.

11. The method of claim 10, further comprising:
    reflowing the first portion of the layer of conductive material to form a conductive bump; and
    removing the photoresist after the reflowing the first portion of the layer of conductive material.

12. The method of claim 10, further comprising:
    reflowing the first portion of the layer of conductive material to form a conductive bump; and
    removing the photoresist prior to the reflowing the first portion of the layer of conductive material.

13. The method of claim 7, further comprising reflowing the first portion of the layer of conductive material to form a conductive bump, wherein the bonding is performed at a lower temperature than the reflowing.

14. The method of claim 7, wherein the providing the layer of conductive material attached to the carrier medium further comprises forming the layer of conductive material on the carrier medium, wherein the forming the layer of conductive material is performed free from electroplating.

15. A method of manufacturing semiconductor devices, the method comprising:
    providing a conductive region over a substrate;
    providing a conductive material on a carrier medium, the conductive material having a first region and a second region, the first region being adjacent the second region in a plane parallel with a major surface of the substrate;
    attaching the first region of the conductive material to the conductive region; separating the second region from the first region; and
    reflowing the first region of the conductive material to form a conductive bump.

16. The method of claim 15, wherein the carrier medium is tape.

17. The method of claim 15, wherein the conductive material comprises bismuth or germanium.

18. The method of claim 15, wherein the conductive region is a conductive pillar.

19. The method of claim 15, wherein the attaching the first region is performed at least in part by heating the first region.

* * * * *